United States Patent
Lee et al.

(10) Patent No.: US 8,319,574 B2
(45) Date of Patent: Nov. 27, 2012

(54) PRINTED CIRCUIT BOARD AND TRANSMITTING/RECEIVING MODULE INCLUDING THE SAME

(75) Inventors: Kyoungho Lee, Hwasung-si (KR); Yoondong Kim, Yongin-si (KR); Su-Bong Jang, Anyang-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 297 days.

(21) Appl. No.: 12/777,772

(22) Filed: May 11, 2010

(65) Prior Publication Data

US 2011/0156843 A1   Jun. 30, 2011

(30) Foreign Application Priority Data

Dec. 24, 2009   (KR) .................. 10-2009-0131097

(51) Int. Cl.
*H01P 5/00* (2006.01)
(52) U.S. Cl. ...................... 333/24 R; 333/116
(58) Field of Classification Search .............. 333/109, 333/110, 111, 112, 116, 238, 24 R
See application file for complete search history.

(56) References Cited

U.S. PATENT DOCUMENTS

| | | | | |
|---|---|---|---|---|
| 3,863,024 A * | 1/1975 | Caragliano et al. | ........... | 375/257 |
| 3,979,699 A * | 9/1976 | Caragliano et al. | ........... | 333/116 |
| 6,388,538 B1 * | 5/2002 | Meier | ................ | 333/24 R |
| 6,590,472 B2 * | 7/2003 | Borodulin et al. | ............ | 333/116 |
| 6,822,532 B2 * | 11/2004 | Kane et al. | ................ | 333/116 |

FOREIGN PATENT DOCUMENTS

JP   1999-167959   6/1999

* cited by examiner

*Primary Examiner* — Dean O Takaoka
(74) *Attorney, Agent, or Firm* — McDermott Will & Emery LLP (57) ABSTRACT

A printed circuit board and a transmitting/receiving module including the same are disclosed. The printed circuit board in accordance with an embodiment of the present invention can include a substrate, a first transmission line, which is formed on one surface of the substrate and transmits an inputted data signal, and a second transmission line, which is capacitively connected to the first transmission line. Here, the first transmission line and the second transmission line transmit an ascending edge and a descending edge of the inputted data signal.

4 Claims, 6 Drawing Sheets

PRINTED CIRCUIT BOARD AND TRANSMITTING/RECEIVING MODULE INCLUDING THE SAME

CROSS-REFERENCE TO RELATED APPLICATIONS

This application claims the benefit of Korean Patent Application No. 10-2009-0131097, filed with the Korean Intellectual Property Office on Dec. 24, 2009, the disclosure of which is incorporated herein by reference in its entirety.

BACKGROUND

1. Technical Field

The present invention is related to a printed circuit board and a transmitting/receiving module including the same.

2. Description of the Related Art

A transmitting/receiving module is a module that is used in electronic devices, such as mobile terminals, televisions and computers.

The transmitting/receiving module can be connected by various methods in order to transmit a data signal. A commonly used example of the various methods is that a transmission line is directly connected between a transmitter and a receiver.

However, the above method of using the transmission line directly connecting the transmitter to the receiver may have a limit in signal integrity and signal transmission speed due to an interference between symbols that is generated by, for example, dielectric loss.

Proposed to solve these problems is a method that serially forms a capacitor on a transmitting/receiving terminal. However, the method may cause dielectric loss of signals transmitted through the transmission line and cause distortion of the signals due to a skin effect. Furthermore, the interference between symbols may cause the jitter.

SUMMARY

The present invention provides a printed circuit board that has a transmission line formed thereon to prevent an interference between symbols, and a transmitting/receiving module including the printed circuit board.

The present invention also provides a printed circuit board that can reduce power consumption by transmitting a signal by way of pulse signaling, and a transmitting/receiving module including the printed circuit board.

Also, the present invention provides a printed circuit board that can reduce the size of a transmitter and a receiver, and a transmitting/receiving module including the printed circuit board.

Furthermore, the present invention provides a printed circuit board that can reduce distortion of signals even though a high-frequency signal is restored, and a transmitting/receiving module including the printed circuit board.

An aspect of the present invention provides a printed circuit board. The printed circuit board in accordance with an embodiment of the present invention can include a substrate, a first transmission line, which is formed on one surface of the substrate and transmits an inputted data signal, and a second transmission line, which is capacitively connected to the first transmission line. Here, the first transmission line and the second transmission line transmit an ascending edge and a descending edge of the inputted data signal.

The printed circuit board can further include a first protruding part, which is protruded from the first transmission line toward the second transmission line, and a second protruding part, which is protruded from the second transmission line toward the first transmission line.

The first protruding part and the second protruding part can be formed alternately.

The second transmission line can be formed on the other surface of the substrate to be overlapped with the first transmission line.

Another aspect of the present invention provides a transmitting/receiving module. The transmitting/receiving module in accordance with an embodiment of the present invention can include a substrate, a transmitter, which transmits a data signal, a first transmission line, which is formed on the substrate and connected to the transmitter, a second transmission line, which is capacitively connected to the first transmission line, and a receiver, which is connected to the second transmission line and receives the data signal. Here, the first transmission line and the second transmission line transmit an ascending edge and a descending edge of the data signal.

The transmitting/receiving module can further include a first protruding part, which is protruded from the first transmission line, and a second protruding part, which is protruded from the second transmission line toward the first transmission line.

The first protruding part and the second protruding part can be formed alternately.

The first transmission line can be overlapped with the second transmission line, in which the substrate is interposed between the first transmission line and the second transmission line.

Additional aspects and advantages of the present invention will be set forth in part in the description which follows, and in part will be obvious from the description, or may be learned by practice of the invention.

DETAILED DESCRIPTION

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed descriptions of related art are omitted when it is deemed that they may unnecessarily obscure the essence of the invention.

While such terms as "first," "second," etc. may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Certain embodiments of the present invention will be described below in detail with reference to the accompanying drawings. For better understanding overall in describing aspects of the present invention, the same reference numerals are used for the same means, regardless of the figure number.

Figure 1:
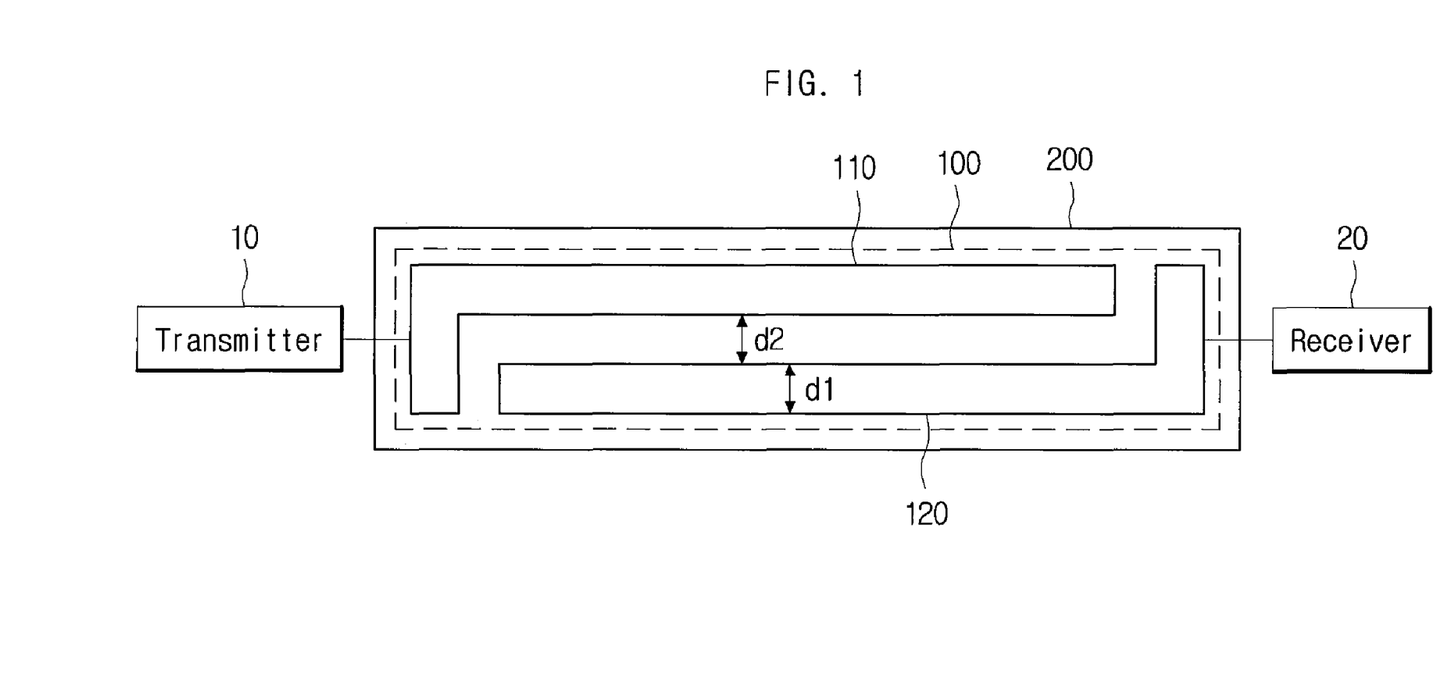
FIG. 1 is a diagram illustrating a transmitting/receiving module in accordance with a first embodiment of the present invention.
Figure 2:
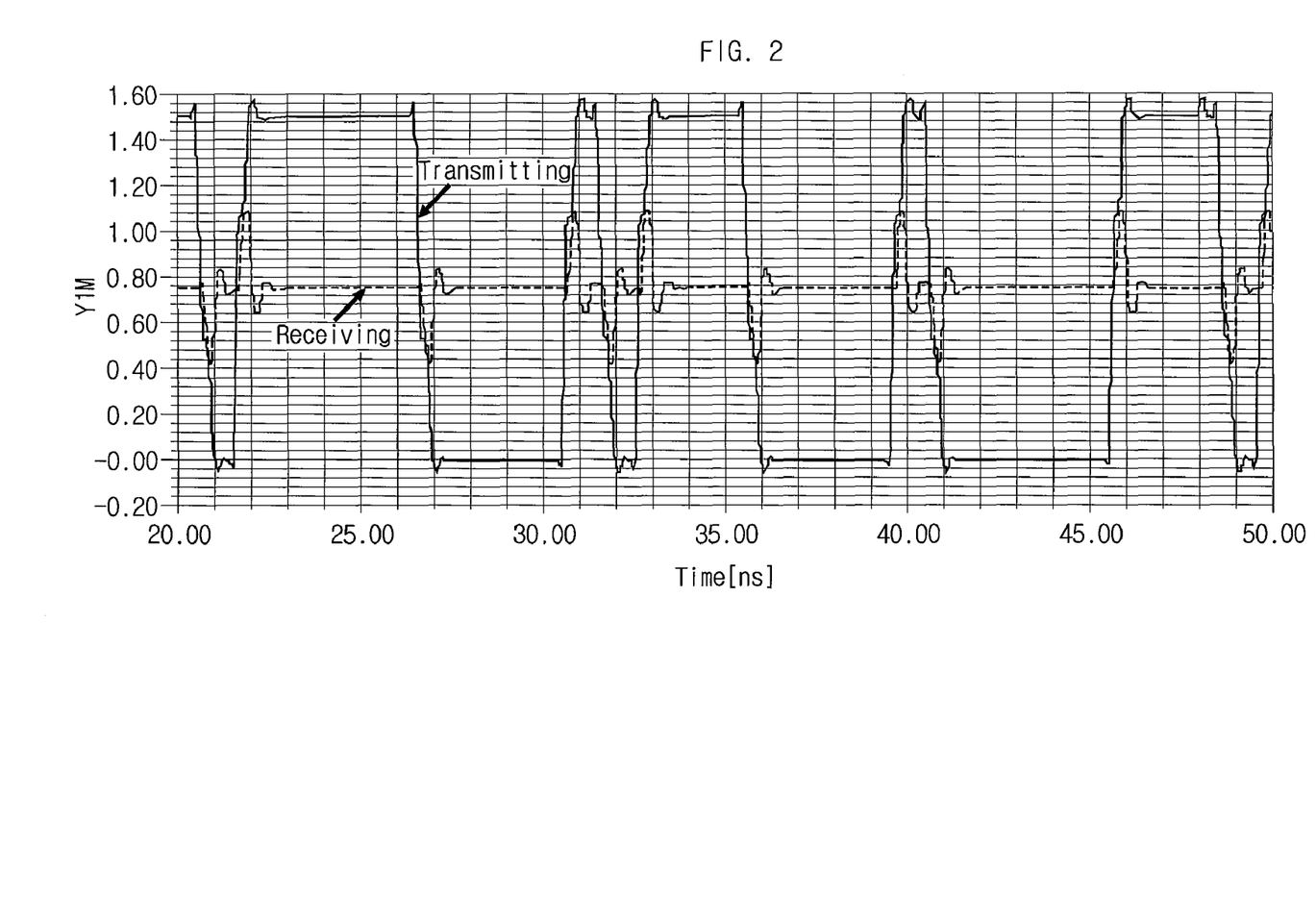
FIG. 2 is a waveform graph illustrating a signal outputted by the transmitter shown in FIG. 1 and a waveform received by the receiver shown in FIG. 1.

FIG. 1 is a diagram illustrating a transmitting/receiving module in accordance with a first embodiment of the present invention, and FIG. 2 is a waveform graph illustrating a signal outputted by the transmitter shown in FIG. 1 and a waveform received by the receiver shown in FIG. 1.

Referring to FIGS. 1 and 2, the transmitting/receiving module of the present embodiment can include a printed circuit board, a transmitter 10 and a receiver 20.

Specifically, the transmitter 10 transmits a series of signals to the receiver 20. The transmitter 10 can transmit a data signal to the receiver 20.

The transmitter 10 can transmit a Non Return to Zero (NRZ) data signal, as illustrated in FIG. 2. However, the signal transmitted by the transmitter 10 is not limited to the NRZ signal, and different forms of data signal can be transmitted by the transmitter 10.

A transmission line 100 can transmit a signal by way of pulse signaling, as illustrated in FIG. 2. Since the transmission line 100 is capacitively connected, the transmission line 100 only allows a signal of ascending edge pulse or descending edge pulse of the NRZ data signal, which is transmitted by the transmitter 10, to be transmitted to the receiver 20.

The receiver 20 detects the signal that is inputted through the transmission line 100. Here, the receiver 20 analyzes the pulses of the inputted signal and restores the pulses to a data signal.

For example, when a first pulse signal is inputted, the receiver 20 determines the first pulse signal as an ascending edge of the data signal, and when a next pulse signal is inputted, the receiver 20 determines the next pulse signal as a descending edge of the data signal. In other words, the receiver 20 can determine signals in odd numbered pulses as the ascending edge and signals in even numbered pulses as the descending edge.

The receiver 20 maintains its state while a pulse signal is not inputted. As illustrated in FIG. 2, the receiver 20 maintains an ascending state while a pulse signal is not received after a pulse having an ascending edge is inputted and maintains a descending state while a pulse signal is not received after a pulse having a descending edge is inputted.

Although the transmitter 10 and the receiver 20 in accordance with the present embodiment are described with an example in which signals in odd numbered pulses are referred to as the ascending edge of the data signal and signals in even numbered pulses as the descending edge of the data signal, it is also possible that signals in even numbered pulses can be referred to as the ascending edge of the data signal and signals in odd numbered pulses as the descending edge of the data signal.

The printed circuit board can include a substrate 200, a first transmission line 110 and a second transmission line 120.

The first transmission line 110 is formed on one surface of the substrate 200. One side of the first transmission line 110 is connected to the transmitter 10, and the other side of the first transmission line 110 is floated. A conductive metal, for example, copper, gold, silver or aluminum, can be used for the first transmission line 110. Also, an alloy of conductive metals can be used for the first transmission line 110.

The second transmission line 120 is formed on one surface of the substrate 200 and adjacent to the first transmission line 110. One side of the second transmission line 120 is connected to the receiver 20, and the other side of the second transmission line 120 is floated. A conductive metal, for example, copper, gold, silver or aluminum, can be used for the second transmission line 120. Also, an alloy of conductive metals can be used for the second transmission line 120.

The first transmission line 110 is capacitively connected to the second transmission line 120. Specifically, the first transmission line 110 and the second transmission line 120 are formed lengthwise in the horizontal direction. The first transmission line 110 is capacitively connected to the second transmission line 120 in such a way that the first transmission line 110 and the second transmission line 120 are separated and parallel from each other by a distance. Specifically, the first transmission line 110 is capacitively connected to the second transmission line 120 in such a way that a dielectric substance (for example, air in the case of FIG. 1) is interposed between the first transmission line 110 and the second transmission line 120.

Here, the line width d1 of the first transmission line 110 and the second transmission line 120 can be about 5 mm, and the distance d2 between the first transmission line 110 and the second transmission line 120 can be about 4 mm. In the transmitting/receiving module in accordance with an embodiment of the present invention, however, the line width d1 of the first transmission line 110 and the second transmission line 120 and the distance d2 between the first transmission line 110 and the second transmission line 120 can be modified in accordance with the lengths of the first transmission line 110 and the second transmission line 120, the frequency of a transmitted signal or the magnitude of the transmitted signal.

Although FIG. 1 illustrates that the transmitter 10 and the receiver 20 are installed outside the substrate 200, it is possible that the transmitter 10 and the receiver 20 are mounted on the substrate 200 having the transmission line 100 formed thereon.

The transmitting/receiving module in accordance with a first embodiment of the present invention can reduce transmission loss of signals during transmission since the first transmission line 110 is capacitively connected to the second transmission line 120. Moreover, the transmission line 100 in accordance with an embodiment of the present invention can prevent the jitter from occurring.

Figure 3:
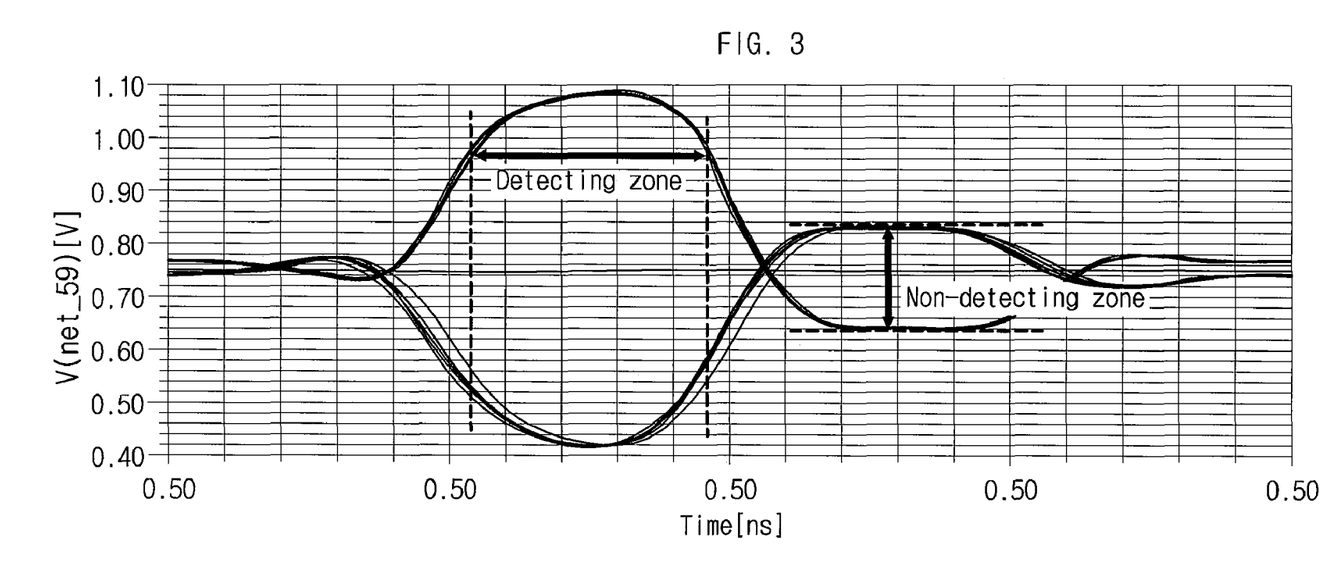
FIG. 3 is an I diagram of a signal transmitted through a transmitting/receiving module in accordance with a first embodiment of the present invention.

FIG. 3 is an I diagram of a signal transmitted through a transmitting/receiving module in accordance with a first embodiment of the present invention.

In the I diagram shown in FIG. 3, a signal of 1 Gbps is transmitted by the transmitter 10 and measured by the receiver 20. As illustrated in FIG. 3, the transmitting/receiving module in accordance with a first embodiment of the present invention can obtain a good diamond-shaped I diagram by analyzing the data of a signal that is transmitted by the transmitter 10 and received by the receiver 20.

With the transmitting/receiving module in accordance with an embodiment of the present invention, distortion of signals can be reduced when restoring the signals even though high-frequency signals are transmitted.

Figure 4:
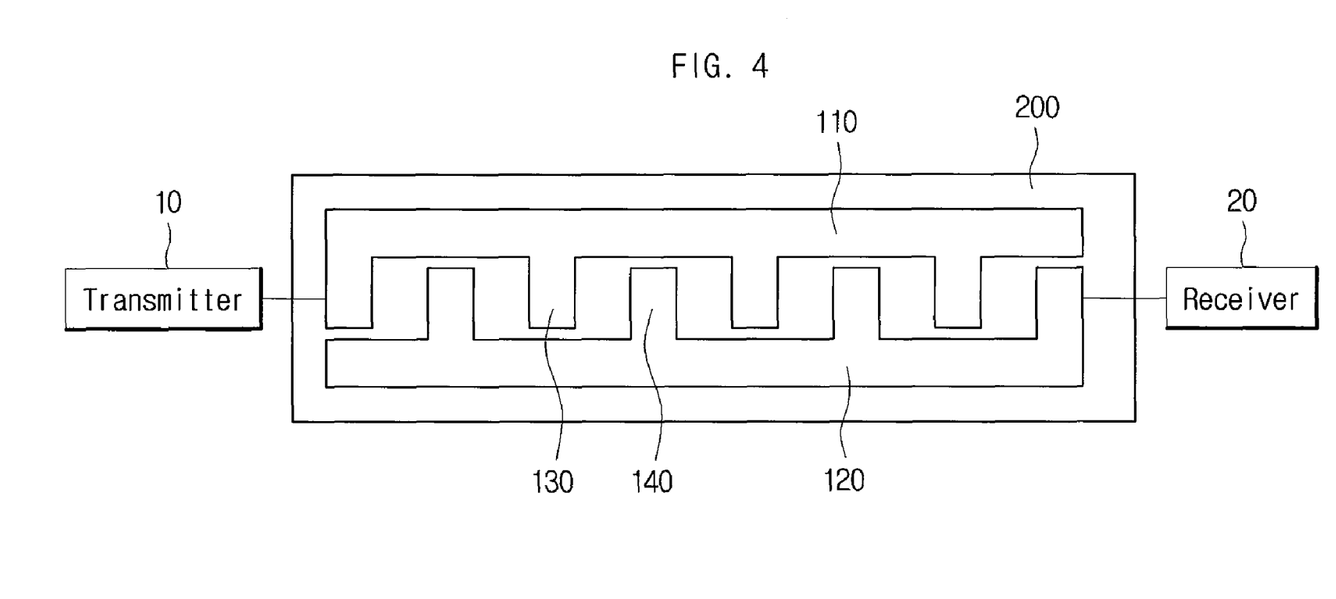
FIG. 4 is a diagram illustrating a transmitting/receiving module in accordance with a second embodiment of the present invention.

FIG. 4 is a diagram illustrating a transmitting/receiving module in accordance with a second embodiment of the present invention.

The transmitter 10, the receiver 20, the first transmission line 110 and the second transmission line 120 shown in FIG. 4 are the same as those of FIG. 1, and thus any redundant description with respect to the same configuration will be omitted.

Referring to FIG. 4, the transmitting/receiving module in accordance with a second embodiment of the present invention can include the transmitter 10, the receiver 20, the first transmission line 110, the second transmission line 120, a first protruding part 130 and a second protruding part 140.

Specifically, the transmitter 10 transmits a data signal. The receiver 20 restores a pulse signal, which has passed through the transmission line 110 from the transmitter 10, to the data signal. This has been described earlier with reference to FIGS. 1 and 2, and thus the pertinent description will be omitted.

The first transmission line 110 and the second transmission line 120 are capacitively connected to each other by having the first transmission line 110 formed on one surface of the substrate 200 and disposing the second transmission line 120 adjacent and parallel to the first transmission line 110. One side of the first transmission line 110 is connected to the transmitter 10, and the other side of the first transmission line 110 is floated. One side of the second transmission line 120 is connected to the receiver 20, and the other side of the second transmission line 120 is floated.

The first protruding part 130 is protruded from the first transmission line 110. At least one first protruding part 130 is protruded toward the second transmission line 120. There can be formed a plurality of first protruding parts 130, as illustrated in FIG. 4. Here, the plurality of first protruding parts 130 can be formed at regular intervals.

The first protruding parts 130 can be made of the same metallic material as that of the first transmission line 110.

The second protruding part 140 is protruded from the second transmission line 120. At least one second protruding part 140 is protruded toward the first transmission line 110. One side surface of the second protruding part 140 is formed close to one side surface of the first protruding part 130. There can be formed a plurality of second protruding parts 140.

Each of the first protruding parts 130 and each of the second protruding parts 140 can be formed alternately, as illustrated in FIG. 4.

Although FIG. 4 shows a rectangular-shaped protruding part as an example, the shape of the protruding part is not limited to this example, and the protruding part can be a polygonal shape or a semicircular shape.

The first protruding parts 130 and the second protruding parts 140 of the transmitting/receiving module in accordance with a second embodiment of the present invention can prevent distortion of transmitted pulse signals by increasing the capacitance between the first transmission line 110 and the second transmission line 120.

Figure 5:
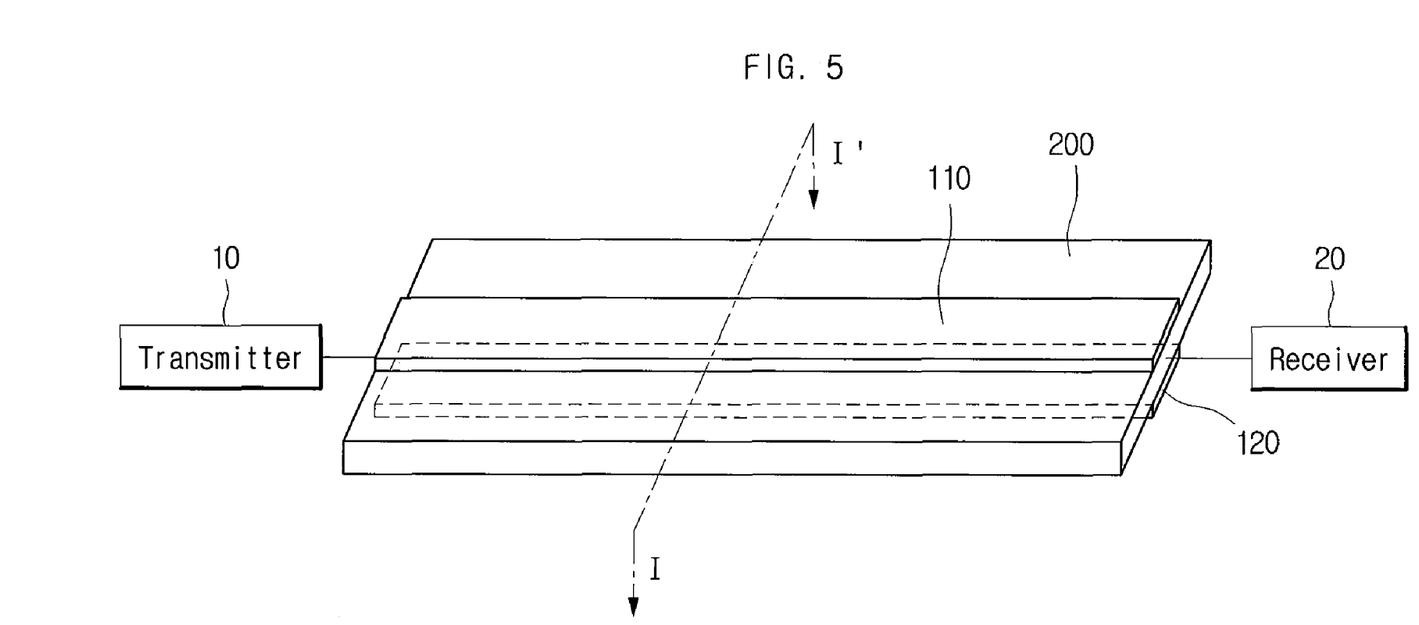
FIG. 5 is a diagram illustrating a transmitting/receiving module in accordance with a third embodiment of the present invention.
Figure 6:
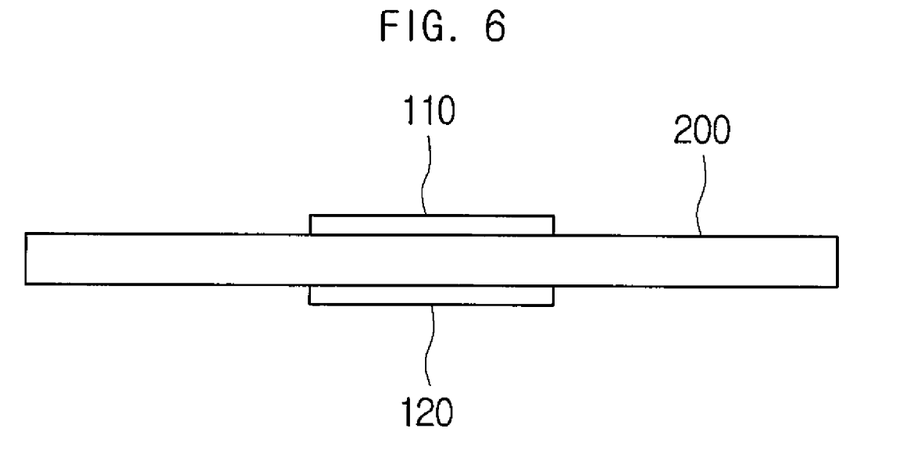
FIG. 6 is a cross-sectional diagram illustrating a transverse section I-I' of the printed circuit board shown in FIG. 5.

FIG. 5 is a diagram illustrating a transmitting/receiving module in accordance with a third embodiment of the present invention, and FIG. 6 is a cross-sectional diagram illustrating a transverse section I-I' of the printed circuit board shown in FIG. 5. The transmitter 10 and the receiver 20 shown in FIG. 5 are the same as those of FIG. 1, but FIG. 5 is another example of capacitive connection between the transmission lines shown in FIG. 1. In the below description with reference to FIGS. 5 and 6, any redundant description with respect to the transmitter 10 and the receiver 20 will be omitted.

Referring to FIGS. 5 and 6, the transmitting/receiving module in accordance with a third embodiment of the present invention can include the transmitter 10, the receiver 20, the first transmission line 110 and the second transmission line 120.

Specifically, the transmitter 10 transmits a data signal, for example, an NRZ data signal. The receiver 20 restores a pulse signal that has passed through the transmission line 100 to the data signal.

The first transmission line 110 is formed on one surface of the substrate 200. One side of the first transmission line 110 is connected to the transmitter 10, and the other side of the first transmission line 110 is floated.

The second transmission line 120 is formed on the other surface of the substrate 200. One side of the second transmission line 120 is connected to the receiver 20, and the other side of the second transmission line 120 is floated. At least a portion of the second transmission line 120 can be overlapped with the first transmission line 110. As illustrated in FIG. 6, the first transmission line 110 is capacitively connected to the second transmission line 120 by having the substrate 200 interposed between the first transmission line 110 and the second transmission line 120 that are overlapped with each other. Here, the substrate 200 functions as a dielectric substance.

The length and line width of the first transmission line 110 and the second transmission line 120 can be determined in accordance with the permittivity of the substrate 200. The length and line width of the first transmission line 110 and the second transmission line 120 can also vary in accordance with the thickness of the substrate 200.

The transmitting/receiving module in accordance with a third embodiment of the present invention has an advantage of efficiently using other surface areas of the substrate 200 since the first transmission line 110 is overlapped with the second transmission line 120.

Although it is not illustrated in FIGS. 5 and 6, the first transmission line 110 and the second transmission line 120 can further include protruding parts. Here, the protruding parts protruded from the first transmission line 110 can be overlapped with the protruding parts protruded from the second transmission line 120. This can increase the capacitance between the first transmission line 110 and the second transmission.

By utilizing certain embodiments of the present invention as set forth above, a transmitting/receiving module by which an interference between symbols is prevented during high-speed signal transmission can be provided.

By utilizing certain embodiments of the present invention as set forth above, a transmitting/receiving module by which power consumption is reduced can be provided.

By utilizing certain embodiments of the present invention as set forth above, the size of a transmitter and a receiver can be reduced.

By utilizing certain embodiments of the present invention as set forth above, distortion of signals can be reduced even though a high-frequency signal is restored.

While the spirit of the invention has been described in detail with reference to certain embodiments, the embodiments are for illustrative purposes only and shall not limit the invention. It is to be appreciated that those skilled in the art can change or modify the embodiments without departing from the scope and spirit of the invention.

What is claimed is:

1. A transmitting/receiving module comprising:
a substrate;
a transmitter configured to transmit a data signal;
a first transmission line formed on the substrate and connected to the transmitter;
a second transmission line capacitively connected to the first transmission line; and
a receiver connected to the second transmission line and configured to receive the data signal from the transmitter, wherein:
the first transmission line and the second transmission line transmit an ascending edge and a descending edge of the data signal, and
the receiver is configured to restore the data signal by analyzing pulse signals inputted through the second transmission line, whereas the receiver determines the ascending edge and the descending edge of the data signal based on an order by which the pulse signals are inputted.

2. The transmitting/receiving module of claim 1, further comprising:
one or more first protruding parts of the first transmission line; and
one or more second protruding parts of the second transmission line disposed toward the first transmission line.

3. The transmitting/receiving module of claim 2, wherein the one or more first protruding parts and the one or more second protruding parts are disposed alternately between the first transmission line and the second transmission line.

4. The transmitting/receiving module according to any one of claims 1 to 3, wherein the first transmission line is overlapped with the second transmission line, the substrate being interposed between the first transmission line and the second transmission line.

* * * * *